(12) United States Patent
Cheng et al.

(10) Patent No.: US 6,842,072 B1
(45) Date of Patent: Jan. 11, 2005

(54) POWER GAIN REDUCTION CIRCUIT FOR POWER AMPLIFIERS

(75) Inventors: Nai-Shuo Cheng, Simi Valley, CA (US); Kevin Choi, Thousand Oaks, CA (US); Peter P. Tran, Oxnard, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/444,751

(22) Filed: May 23, 2003

(51) Int. Cl.[7] ............................................. H03G 3/20
(52) U.S. Cl. ............................. 330/136; 330/129
(58) Field of Search ............................ 330/284, 300, 330/296, 278, 129, 136

(56) References Cited

U.S. PATENT DOCUMENTS 3,451,006 A  *  6/1969  Grangaard, Jr. ............... 330/69
3,548,332 A  *  12/1970  Omura et al. ................ 330/284
3,641,449 A  *  2/1972  Engelhardt .................. 330/284
4,178,482 A  *  12/1979  Ouellette ..................... 370/201

* cited by examiner

Primary Examiner—Henry Choe
(74) Attorney, Agent, or Firm—Farjami & Farjami LLP

(57) ABSTRACT

According to one exemplary embodiment, a gain reduction circuit comprises a first terminal, where the first terminal is coupled to a control signal. The gain reduction circuit further comprises a second terminal, where the second terminal is coupled to an input of an amplifier, and where the amplifier is configured to operate in low-power mode and high-power mode. The gain reduction circuit further comprises a transistor coupled to the first terminal and the second terminal. The transistor can be, for example, a bipolar transistor, such as an NPN GaAs heterojunction bipolar transistor, having a base, a collector, and an emitter, where the base being is coupled the control signal, the collector is coupled to the input of the amplifier, and the emitter is coupled to ground. According to this exemplary embodiment, the transistor causes a gain of the amplifier to be reduced when the amplifier is operating in low-power mode.

18 Claims, 2 Drawing Sheets

POWER GAIN REDUCTION CIRCUIT FOR POWER AMPLIFIERS

BACKGROUND OF THE INVENTION

1. Field of the Invention

The present invention is generally in the field of amplifiers. More specifically, the invention is in the field of power amplifiers for communication devices.

2. Related Art

A continuing desire to significantly improve the talk time of cellular handsets using various wireless communication standards, such as code-division multiple access ("CDMA"), time-division multiple access ("TDMA"), and global system for mobile communications ("GSM"), has led to the development of high efficiency power amplifiers. To achieve a further reduction in battery current consumption, many power amplifiers used in cellular handsets have been designed to operate efficiently, not only at maximum output power in a high-power mode, but also at lower output power in a low-power mode. In the low-power mode, low power consumption is often achieved by using a mode-control circuit to reduce current consumption by reducing bias voltage applied to the power amplifier. Although the mode-control circuit reduces the current consumption of the power amplifier, the mode-control circuit causes only a minimal reduction in the power gain of the power amplifier. As a result, the mode-control circuit fails to provide a sufficient reduction in the power output level of the power amplifier in the low-power mode to meet a minimum power specification.

In one attempt to achieve a power amplifier having the necessary low current consumption and power gain reduction required to meet the minimum power specification, device manufacturers have controlled the reference voltage ("Vref") applied to the power amplifier to reduce gain while utilizing mode-control circuitry to reduce the power amplifier's current consumption. Although controlling Vref to reduce power gain and utilizing mode-control circuitry to reduce current consumption allows the power amplifier to meet the minimum power specification in low-power mode, the circuitry required to control Vref is difficult to implement.

In another attempt to meet the minimum power specification in low-power mode, one of more stages of the power amplifier can be bypassed to sufficiently reduce the power gain of the power amplifier. However, this approach requires an additional switch, which undesirably increases circuit complexity. A further attempt utilizes an external attenuator to reduce the power gain of the power amplifier sufficiently to meet the minimum power specification in the low-power mode. However, this approach requires additional components, which undesirably increase manufacturing cost and complicate the design process of a cellular handset utilizing the power amplifier.

Thus, there is a need in the art for a means for reducing power gain in a power amplifier, such as a power amplifier used in a cellular handset, that is effective, easy to implement, and cost effective.

SUMMARY OF THE INVENTION

The present invention is directed to power gain reduction circuit for power amplifiers. The present invention addresses and resolves the need in the art for a means for reducing power gain in a power amplifier, such as a power amplifier used in a cellular handset, that is effective, easy to implement, and cost effective.

According to one exemplary embodiment, a gain reduction circuit comprises a first terminal, where the first terminal is coupled to a control signal. The gain reduction circuit further comprises a second terminal, where the second terminal is coupled to an input of an amplifier, and where the amplifier is configured to operate in a low-power and a high-power mode. The gain reduction circuit further comprises a transistor coupled to the first terminal and the second terminal. The transistor can be, for example, a bipolar transistor, such as an NPN GaAs heterojunction bipolar transistor, having a base, a collector, and an emitter, where the base being is coupled the control signal, the collector is coupled to the input of the amplifier, and the emitter is coupled to a ground.

According to this exemplary embodiment, the transistor causes a gain of the amplifier to be reduced when the amplifier is operating in the low-power mode. The gain of the amplifier is reduced when the control signal causes the transistor to turn on, for example. The gain reduction circuit further comprises a capacitor, where the capacitor couples the collector of the transistor to the input of the amplifier. Other features and advantages of the present invention will become more readily apparent to those of ordinary skill in the art after reviewing the following detailed description and accompanying drawings.

DETAILED DESCRIPTION OF THE INVENTION

The present invention is directed to power gain reduction circuit for power amplifiers. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. The present invention applies to a power amplifier used in wireless communication devices, such as cellular handsets, using different wireless communication standards, such as CDMA, TDMA, and GSM.

Figure 1:
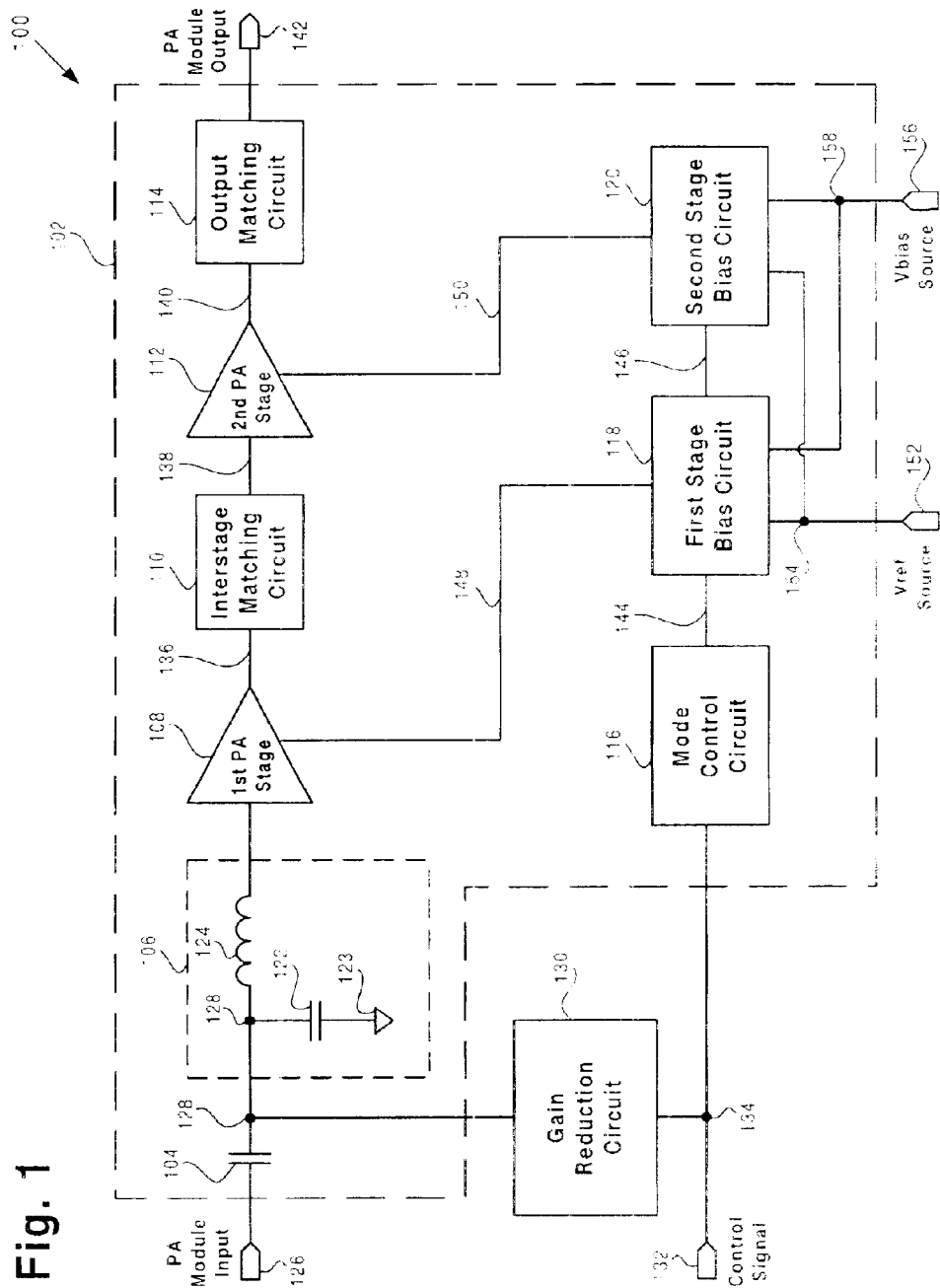
FIG. 1 is a block diagram of an exemplary gain reduction circuit coupled to an exemplary power amplifier module in accordance with one embodiment of the present invention.

FIG. 1 shows a block diagram of an exemplary gain reduction circuit coupled to an exemplary power amplifier module in accordance with one embodiment of the present invention. Certain details and features have been left out of FIG. 1, which are apparent to a person of ordinary skill in the art. Power amplifier ("PA") module 102 includes capacitor 104, input matching circuit 106, first PA stage 108, inter-stage matching circuit 110, second PA stage 112, output matching circuit 114, mode control circuit 116, first stage bias circuit 118, and second stage bias circuit 120. Input matching circuit 106 comprises capacitor 122 and inductor 124, which are exemplary input matching circuit components. However, input matching circuit 106 can comprise other components and can be implemented in a different manner. PA module 102 is a linear PA module that can be used in wireless communications devices, such as cellular handsets, and is configured to operate in a low-power mode and a high-power mode. PA module 102 also includes other circuits not shown in FIG. 1 to preserve brevity. Although PA module 102 is shown as having only two PA stages (i.e. first and second PA stages 108 and 112, respectively) for simplicity of illustration, PA module 102 can have any number of PA stages.

As shown in FIG. 1, PA module input 126 is coupled to a first terminal of capacitor 104. In the present embodiment, PA module input 126 can comprise a radio frequency ("RF") signal. In another embodiment, PA module input 126 may comprise a signal other than an RF signal. Capacitor 104 prevents DC voltage at PA module input 126 from entering the input of first PA stage 108 via inductor 124. A second terminal of capacitor 104 is coupled to a first terminal of capacitor 122, a first terminal of inductor 124, and a second terminal of gain reduction circuit 130 at node 128. Capacitor 122 and inductor 124 provide impedance matching between an input circuit (not shown in FIG. 1) coupled to PA module input 126 and an input of first PA stage 108. A second terminal of capacitor 122 is coupled to reference voltage 123, which can be, for example, a ground voltage or constant DC voltage with no AC component.

Also shown in FIG. 1, a first terminal of gain reduction circuit 130 is coupled to control signal 132 and an input to mode control circuit 116 at node 134. Gain reduction circuit 130 can be configured to appropriately reduce the power gain of PA module 102 when PA module 102 is operating in a low-power mode. Gain reduction circuit 130 is activated when control signal 132 comprises a sufficiently high voltage, such as a voltage greater than approximately 1.5 volts, in the low-power mode. The present invention's gain reduction circuit 130 will be described in greater detail in relation to FIG. 2.

Further shown in FIG. 1, a second terminal of inductor 124 is coupled to the input of first PA stage 108, which can be configured to amplify a signal, such as an RF signal, inputted at PA module input 126. The output of first PA stage 108 is coupled to the input of interstage matching circuit 110 via line 136. Interstage matching circuit 110 can be configured to match the impedance of first PA stage 108 with the impedance of second PA stage 112. Also shown in FIG. 1, the output of interstage matching circuit 110 is coupled to the input of second PA stage 112 via line 138 and can be configured to provide further amplification of the signal outputted from first PA stage 108. The output of second PA stage 112 is coupled to the input of output matching circuit 114 via line 140. Output matching circuit 114 provides impedance matching between an output circuit (not shown in FIG. 1) coupled to PA module output 142, which outputs an amplified signal, such as an amplified RF signal.

Also shown in FIG. 1, the output of mode control circuit 116 is coupled to the input of first stage bias circuit 118 via line 144. Mode control circuit 116 can be configured to reduce current consumption of first and second PA stages 108 and 112 in a low-power mode by reducing the bias voltage supplied to first and second power amplifier stages 108 and 112 via first and second stage bias circuit 118 and 120, respectively. Mode control circuit 116 can be activated in the low-power mode via control signal 132. Further shown in FIG. 1, an output of first stage bias circuit 118 is coupled to second stage bias circuit 120 via line 146. First stage bias circuits 118 and 120 can be configured to provide bias voltage to first and second PA stages 108 and 112 via lines 148 and 150, respectively.

Also shown in FIG. 1, Vref source 152 is coupled to first and second stage bias circuits 118 and 120 at node 154 and Vbias source 156 is coupled to first and second stage bias circuits 118 and 120 at node 158. First and second stage bias circuits 118 and 120 can be configured to receive a reference voltage at Vref source 152 and a bias voltage at Vbias source 156, which can be adjusted independently of Vcc (not shown in FIG. 1). As a result of the reduced gain of PA module 102 achieved by the present invention's gain reduction circuit 130 in low-power mode, the reference voltage at Vref source 152 advantageously remains at a constant voltage.

Figure 2:
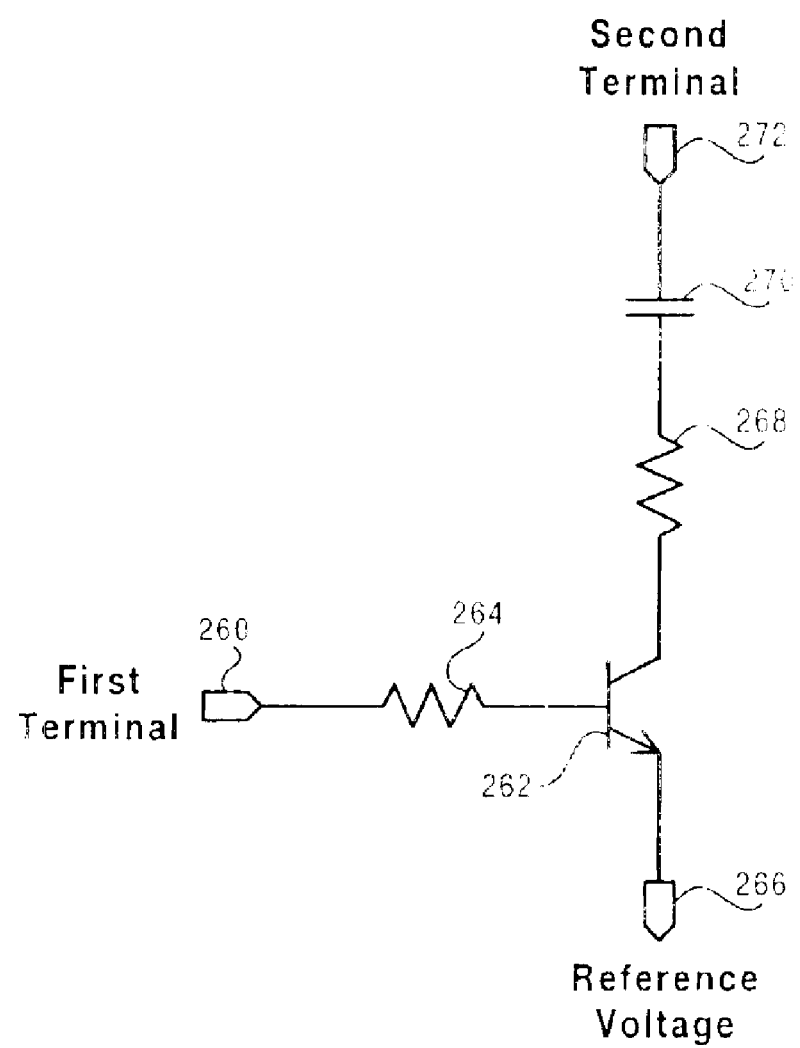
FIG. 2 illustrates a circuit diagram of an exemplary gain reduction circuit in accordance with one embodiment of the present invention.

FIG. 2 shows a schematic diagram of exemplary gain reduction circuit 230 in accordance with one embodiment of the present invention. Gain reduction circuit 230 corresponds to gain reduction circuit 130 in FIG. 1. Gain reduction circuit 230 includes terminals 260 and 272, transistor 262, resistors 264 and 268, and capacitor 270. As shown in FIG. 2, first terminal 260 of gain reduction circuit 230 is coupled to a first terminal of resistor 264. In one embodiment, gain reduction circuit 230 can be formed on a GaAs integrated circuit ("IC"). First terminal 260 is coupled to control signal 132 of PA module 102 in FIG. 1, which is utilized to activate gain reduction circuit 230 in a low-power mode. Also shown in FIG. 2, a second terminal of resistor 264 is coupled to the base of transistor 262. Transistor 262 is configured to function as a switch and can be an NPN bipolar transistor, such as an NPN gallium arsenide ("GaAs") heterojunction bipolar transistor ("HBT"). In other embodiments, transistor 262 can be an NPN silicon-only bipolar transistor, a field effect transistor ("FET"), a PNP bipolar transistor, or other type of HBT that is configured to function as a switch.

Further shown in FIG. 2, the emitter of transistor 262 is coupled to reference voltage 266, which can be a ground voltage ("ground"). In one embodiment, reference voltage 266 can be a reference voltage having a constant DC voltage with no AC component. Also shown in FIG. 2, a first terminal of resistor 268 is coupled to the collector of transistor 262 and a second terminal of resistor 268 is coupled to a first terminal of capacitor 270. Capacitor 270 prevents DC voltage at second terminal 272 126 from reaching the collector of transistor 262 and can be, for example, a metal-insulator-metal ("MIM") capacitor. Further shown in FIG. 2, a second terminal of capacitor 270 is coupled to second terminal 272 of gain reduction circuit 230. Second terminal 272 is coupled to node 128 of power amplifier module 102 in FIG. 1.

The function and operation of gain reduction circuit 230 in FIG. 2 will now be discussed in relation to PA module 102 in FIG. 1. In low-power mode, a control signal (i.e. control signal 132) having a sufficiently high voltage, such as a voltage greater than approximately 1.5 volts, is inputted to first terminal 260 of gain reduction circuit 230 and coupled to the base of transistor 262. As a result, transistor 262 turns on, which creates a low impedance path between second terminal 272 and reference voltage 266 (i.e. ground) via capacitor 270, resistor 268 and the collector of transistor 262. Since the RF input signal at PA module input 126 is coupled to second terminal 272 of gain reduction circuit 230 at node 128, a pre-determined amount of RF input power is diverted to the low impedance path and becomes attenuated. As a result, the power gain of PA module 102 is reduced. By appropriately selecting capacitor 270, resistor 268, and transistor 262, the power gain of PA module 102 can be sufficiently reduced such that the minimum power specification can be met in low-power mode.

In high-power mode, a control signal (i.e. control signal 132) having a sufficiently low voltage, such as a voltage less than approximately 0.2 volts, is inputted to first terminal 260 of gain reduction circuit 230 and coupled to the base of transistor 262, which causes transistor 262 to shut off. As a result, a significantly high impedance path is created between node 128 and reference voltage 266 via capacitor 270, resistor 268 and the collector of transistor 262. The significantly high impedance path is seen as a substantially open circuit by PA module 102. As a result, substantially no RF input power is attenuated by the significantly high impedance path and the power gain of PA module 102 is maintained in high-power mode.

As discussed above, by coupling the present invention's gain reduction circuit to a PA module input, the power gain of the PA module can be appropriately reduced in a low-power mode and maintained in a high-power mode. As a result, the present invention advantageously achieves an effective, easy to implement, and cost-effective means of appropriately controlling the power gain of the PA module in low-power and high-power modes. Moreover, by appropriately controlling the power gain of the PA module in low-power mode and utilizing a mode control circuit to appropriately reduce current consumption of the PA module, the present invention advantageously allows the PA module to meet the minimum power specification.

It is appreciated by the above detailed description that the invention provides a gain reduction circuit that is effective, easy to implement, and cost-effective. From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, power gain reduction circuit for power amplifiers has been described.

What is claimed is:

1. A gain reduction circuit, said circuit comprising:
   a first terminal, said first terminal being coupled to a control signal;
   a second terminal, said second terminal being coupled to an input of an amplifier, said amplifier being configured to operate in a low-power mode and a high-power mode;
   a transistor coupled to said first terminal and said second terminal;
   wherein said transistor causes a gain of said amplifier to be reduced when said amplifier is operating in said low-power mode;
   wherein said control signal is coupled to a mode control circuit, said mode control circuit causing a reduction in current consumed by said amplifier when said amplifier is operating in said low-power mode.

2. The circuit of claim 1 wherein said gain of said amplifier is reduced when said control signal causes said transistor to turn on.

3. The circuit of claim 1 wherein said transistor is a bipolar transistor having a base, a collector, and an emitter, said base being coupled to said control signal, said collector being coupled to said input of said amplifier, said emitter being coupled to a ground.

4. The circuit of claim 3 wherein said bipolar transistor is an NPN GaAs heterojunction bipolar transistor.

5. The circuit of claim 3 further comprising a capacitor, said capacitor coupling said collector to said input of said amplifier.

6. The circuit of claim 1 wherein said transistor is a FET.

7. The circuit of claim 1 wherein said control signal causes said transistor to turn on when said amplifier is operating in said low-power mode and to turn off when said amplifier is operating in said high-power mode.

8. A gain reduction circuit, said circuit comprising:
   a first coupling means for coupling to a control signal;
   a second coupling means for coupling to an input of an amplifier, said amplifier being configured to operate in a low-power mode and a high-power mode;
   a switching means coupled to said first coupling means and said second coupling means;
   wherein said switching means causes a gain of said amplifier to be reduced when said amplifier is operating in said low-power mode;
   wherein said control signal is coupled to a mode control circuit, said mode control circuit causing a reduction in current consumed by said amplifier when said amplifier is operating in said low-power mode.

9. The circuit of claim 8 wherein said gain of said amplifier is reduced when said control signal causes said switching means to turn on.

10. The circuit of claim 8 wherein said switching means is a bipolar transistor having a base, a collector, and an emitter, said base being coupled to said control signal, said collector being coupled to said input of said amplifier, said emitter being coupled to a ground.

11. The circuit of claim 10 wherein said bipolar transistor is an NPN GaAs heterojunction bipolar transistor.

12. The circuit of claim 10 further comprising a DC blocking means, said DC blocking means coupling said collector to said second coupling means.

13. The circuit of claim 8 wherein said switching means is a FET.

14. The circuit of claim 8 wherein said control signal causes said switching means to turn on when said amplifier is operating in said low-power mode and to turn off when said amplifier is operating in said high-power mode.

15. A gain reduction circuit, said circuit comprising:
   a transistor, said transistor having a base, a collector, and an emitter;
   a first terminal, said first terminal being coupled to said base of said transistor and a control signal;
   a second terminal, said second terminal being coupled to said collector of said transistor and an input of an amplifier, said amplifier being configured to operate in a low-power mode and a high-power mode;
   wherein said transistor causes a gain of said amplifier to be reduced when said amplifier is operating in said low-power mode;
   wherein said control signal is coupled to a mode control circuit, said mode control circuit causing a reduction in current consumed by said amplifier when said amplifier is operating in said low-power mode.

16. The circuit of claim 15 wherein said gain of said amplifier is reduced when said control signal causes said transistor to turn on.

17. The circuit of claim 15 wherein said transistor is an NPN GaAs heterojunction bipolar transistor.

18. The circuit of claim 15 further comprising a capacitor, said capacitor coupling said collector to said input of said amplifier.

* * * * *